United States Patent [19]

Heremans et al.

[11] Patent Number: 4,847,666
[45] Date of Patent: Jul. 11, 1989

[54] HOT ELECTRON TRANSISTORS

[75] Inventors: Joseph P. Heremans, Troy; Dale L. Partin, Sterling Heights, both of Mich.

[73] Assignee: General Motors Corporation, Detroit, Mich.

[21] Appl. No.: 135,052

[22] Filed: Dec. 17, 1987

[51] Int. Cl.$^4$ ............... H01L 29/24; H01L 29/68
[52] U.S. Cl. ........................... 357/16; 357/4; 357/33; 357/61
[58] Field of Search ............... 357/4, 16, 34, 23.2, 357/22 A, 61, 33

[56] References Cited

U.S. PATENT DOCUMENTS

| | | | |
|---|---|---|---|
| 4,149,174 | 4/1979 | Shannon | 357/34 |
| 4,286,275 | 8/1981 | Heiblum | 357/12 |
| 4,366,493 | 12/1982 | Braslau | 357/4 |
| 4,532,533 | 7/1985 | Jackson et al. | 357/15 |
| 4,577,322 | 3/1986 | Partin | 372/44 |
| 4,608,694 | 8/1986 | Partin | 372/44 |
| 4,612,644 | 9/1986 | Partin | 372/44 |
| 4,639,753 | 1/1987 | Yamada | 357/22 |
| 4,649,405 | 3/1987 | Eastman | 357/3 |
| 4,672,404 | 6/1987 | Ankri et al. | 357/16 |
| 4,684,805 | 8/1987 | Lee et al. | 250/343 |
| 4,712,121 | 12/1987 | Yokoyama | 357/4 |

FOREIGN PATENT DOCUMENTS 93557 11/1983 European Pat. Off. ........... 357/23.2

OTHER PUBLICATIONS

Laff, IBM Tech Disel. Bulletin, v. 7, No 5, Oct. 1964, pp. 411–412.
Jerry E. Bishop, "Silicon Successor? Computer Scientists Eye New Raw Material for Semiconductors," *Wall Street Journal*, pp. 1 and 8, vol. LXVIII, No. 159 (25 May 1987).
S. M. Sze, "Physics of Semiconductor Devices," Second Edition, John Wiley & Sons, New York, 1969, pp. 182–188 and pp. 558–565.
M. Heiblum, "Ballistic Transport in Hot Electron Transistors", *Bulletin of American Physical Society*, vol. 31, No. 3, p. 417 (31 Mar–4 Apr. 1986).
A. F. J. Levi et al, "Ballistic Injection Devices in Semiconductors," Appl. Phys. Lett. 48(23), 9 Jun. 1986, pp. 1609–1611.
Y. I. Ravich et al, "Scattering of Current Carriers and Transport Phenomena in Lead Chalcogenides–I. Theory," Review Article, Phys, Stat. Sol. (b) 43, 11 (1971), Institute of Semiconductors, State Institute of Current Sources, Leningrad, pp. 12–13; 16–17; 19–21; 23–25; 27–29; 31–33.
Y. I. Ravich et al, "Scattering of Current Carriers and Transport Phenomena in Lead Chalcogenides–II. Experiment," Review Article, Phys. Stat. Sol. (b) 43, 453 (1971), Institute of Semiconductors, State Institute of Current Sources, Leningrad, pp. 454–469.
T. Takagi et al, "Ionized–Cluster Beam Epitaxy of CdTe and its Application to CdTe/PbTe Multilayer Structure," *Thin Solid Films*, 126 (1984), pp. 149–154.
S. C. Shin et al, "Preparation and X-Ray Diffraction Studies of Compositionally Modulated PbTe/Bi Films," *Thin Solid Films*, 111 (1984), pp. 323–330.
J. Heremans and J. P. Michenaud, "Electronic Magnetostriction of $Bi_{1-x}Sb_x$ Alloys," Phys, C: Solid State Phys., 18 (185), pp. 6033–6042.
J. Yoshino et al, "Growth of PbTe/CdTe on GaAs (100)," J. Vac. Sci. Technol. B 5 (3), May/Jun. 1987, pp. 683–685.
L. A. Kolodziejski et al, "Molecular Beam Epitaxy of Diluted Magnetic Semiconductor $(Cd_{1-x}Mn\ Te)$ Superlattices," Appl. Phys. Lett. 45 (4), 15 Aug. 1984, pp. 440–442.
H. Zogg, "Strain Relief in Epitaxial Fluoride Buffer Layers for Semiconductor Heteroepitaxy," *Appl. Phys. Lett.* 49 (15), 13 Oct. 1986, pp. 933–935.
M. Heiblum et al, "Tunneling Hot–Electron Transfer Amplifier: A Hot–Electron GaAs Device with Current Gain," *Appl. Phys. Lett.* 47 (10), 15 Nov. 1985, pp. 1105–1107.

Primary Examiner—William D. Larkins
Attorney, Agent, or Firm—Robert J. Wallace

[57] ABSTRACT

In one embodiment a hot electron transistor uses lead telluride as the host crystal. The desired layers of increased band gap to provide the needed heterojunctions at the emitting and collecting junctions are realized either by substitution of europium and selenium in the host crystal or by superlattices of PbTe-CdTe. Variations described use either a tunneling barrier, graded barrier or camel diode barrier are used at the emitting junction. Other embodiments use a bismuth-antimony semiconductor alloy for one or more of the layers of the crystal.

13 Claims, 3 Drawing Sheets

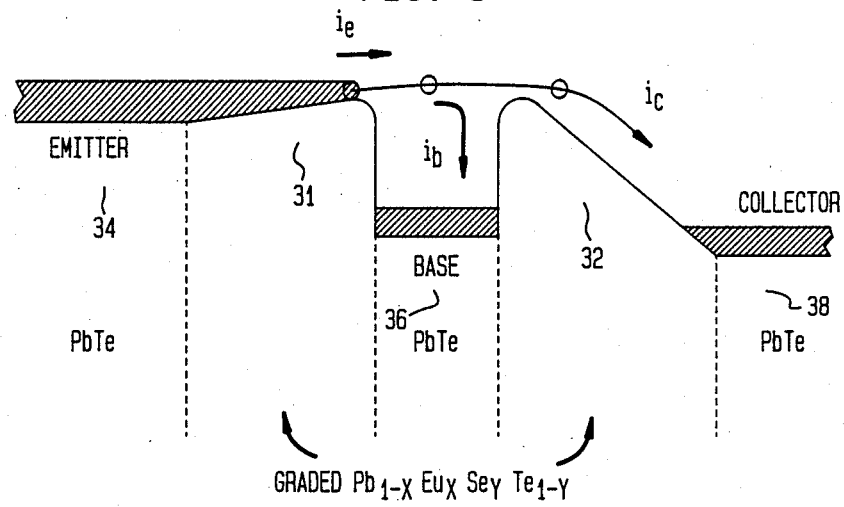
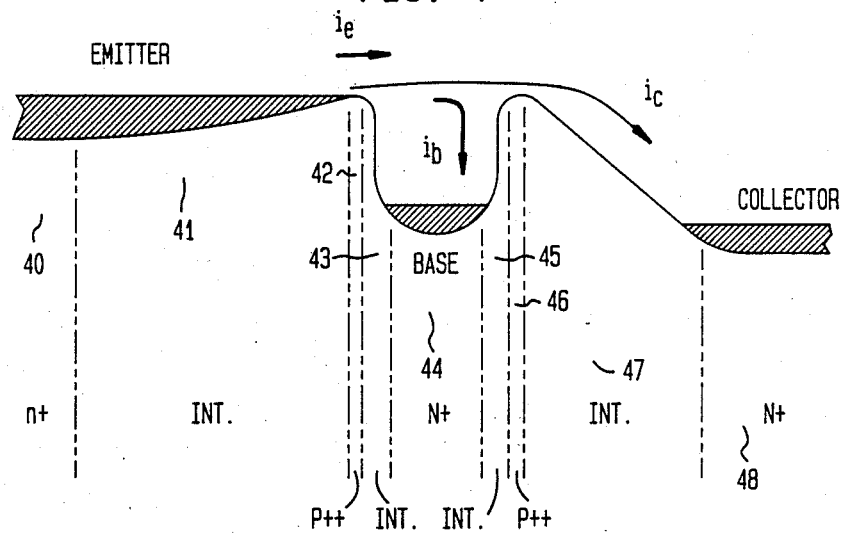

HOT ELECTRON TRANSISTORS

FIELD OF THE INVENTION

This invention relates to semiconductive device and more particularly to such devices of the kind now described as hot electron or ballistic transistors.

BACKGROUND OF THE INVENTION

A hot electron or ballistic transistor typically includes emitter, base and collector zones, as in a junction transistor, but is characterized by an especially thin base through which change carriers pass at high velocity in short transit times without significant collisions.

A ballistic transistor of particular promise is one that has been described as a tunneling hot-electron transfer amplifier (THETA) device, and whose principles are described in a paper entitled, "Tunneling Hot-Electron Transfer Amplifier: A Hot Electron GaAs Device With Current Gain," published in *Applied Physics Letters* 47, (10) 15 November 1985, pp. 1105–1107 by M. Herklum et al. In this form of ballistic transistor, the applied voltage causes electrons to tunnel from emitter to base to provide an emitter current $I_e$. The tunneling electrons are made to enter the base with excess kinetic energy larger than the effective collector barrier height and some of these electrons surmount the barrier and produce a collector current $I_c$ with a transfer coefficient $A = I_c/I_e$. Typically, to achieve the desired operation, the device has used heterojunctions between the emitter and the base and between the base and the collector, and is maintained at low temperatures to maximize the mean free path of the electrons.

Various materials have been proposed for use in ballistic transistors to achieve the desired operation. Generally, it has been recognized that there are desirable combinations of semiconductor materials with carriers of high mobility and long mean free paths that can be lattice matched to form a single crystal structure of high quality. In the past, emphasis has been on combinations involving Group III–Group V compounds including gallium, aluminum, indium, arsenic, etc as the constituent atoms, since such compounds were relatively well understood and believed to be of the most promise.

The $Al_{1-x}Ga_xAs$/GaAs material system has been most used for devices so far. However, the relatively short mean free path of hot electrons in GaAs has let to some consideration being given to the InAs/GaInAsSb material system, which can also be lattice/matched. InSb has also been mentioned as a suitable material for a base material in a hot electron transistor. However, a severe problem in this case is that no other conventional Group III–Group V compound lattice-matches to it.

These alternatives to $Al_{1-x}Ga_xAs$/GaAs have been regarded as potentially useful because moderately hot electrons in them would have relatively long mean free paths, allowing relatively thick base layers. This would decrease base sheet resistance, thus desirably decreasing the parasitic RC time constant of the device. It would be advantageous to dope a base region moderately heavily with electrons (greater than $5 \times 10^{17}$ cm$^{-3}$) in order to further reduce the base sheet resistance and hence the RC time constant, but this would greatly reduce the hot electron mean free path and also the electron mobility, because of increased electron-ionized donor and electron-electron scattering. The decreased electron mobility means that the base sheet resistance is not reduced as much as it otherwise would be. Moreover, the decreased hot electron mean free path means that thinner base layers muct be used to maintain an adequate transfer coefficient, further increasing the base sheet resistance and RC time constant, thus limiting the improvement in device switching time. Thus, it has been necessary to make comprises in device design and to utilize a lighter doping and higher sheet resistance for the base than is otherwise desirable.

These considerations have been largely described in a publication by A. F. J. Levi, J. R. Hayes, and R. Bhat in *Applied Physics Letters*, Volume 48, page 1609, in 1986. An additional problem that was described for these materials and for the HgTe/CdTe material system is that electrons that are too hot can lose energy by exciting electrons directly from the valence band of the base to the conduction band of the base. To avoid this loss mechanism, the hot electron energy, E, must be constrained as follows:

$$E < E_F + E_G, \qquad (1)$$

where $E_F$ is the fermi energy relative to the conduction band edge and $E_G$ is the energy band gap. Thus, for narrow energy gap semiconductors such as InSb, inequality (1) becomes a significant constraint.

SUMMARY OF THE INVENTION

We have found that there are fundamental factors, not been previously appreciated, that can be used to improve these devices by relaxing a number of the above constraints and compromises. The first of these is that, in narrow energy gap semiconductors, non-parabolicity of the conduction band at hot electron energies means that the electrons are best described as propagating at a group velocity, and that this velocity is near the speed of light in the material. The group velocity $V_g$ is given by $$V_g = (2\pi/h)(dE/dK),$$

where h is Plank's constant, E is the carrier energy and K is the carrier wavevector.

Thus, hot electrons may have velocities greater than $10^9$ cm sec$^{-1}$ in such semiconductors. Thus, the travel time of electrons from the emitter to the collector in devices using such materials is greatly decresed at these high velocities, and the switch time is related to this travel time.

Secondly, in certain narrow energy gap materials, such as Group IV–Group VI lead salts, especially PbTe, and also in $Bi_{1-x}Sb_x$ (where $0 < \text{or} = x < \text{or} = 0.35$) a Group V–Group V alloy to be denoted herein as a bismuth-antimony alloy, inequality (1) is altered to become $$E < 2E_F + E_G \qquad (2)$$

This is because in the carrier energy vs. momentum dispersion relations in these materials, the conduction band minima are not coincident in carrier momentum with heavy hole valence band maxima, but only with light hole band maxima. Furthermore, the light hole and electron bands are approximately mirror images of each other (at the L-points of the Brillouin zone). For example, the light hole masses near their band maxima are nearly equal to electron masses for the same momentum. (A T-point valence band maxima in $Bi_{1-x}Sb_x$ is not relevant because of momentum conservation considerations.) Inequality (2) follows from these factors under the requirement of conservation of momentum. Thus, for lead salt and bismuth antomony alloy ($Bi_{1-x}Sb_x$) small energy gap semiconductors where $E_F$ may be larger than or of the order of $E_G$ electrons can be heated to significantly higher energies without losing energy by exciting valence band to conduction band transitions. By contrast, the above-mentioned Group III-Group V semiconductors and also HgTe/CdTe are gamma point semiconductors for which inequality (1) applies.

Thirdly, the dielectric constant is anomalously large in PbTe and in $Bi_{1-x}Sb_x$ compared to more conventional semiconductors which have been mentioned above in connection with hot electron devices. This means that electron scattering by other electrons and by ionized donors is greatly reduced. This implies that relatively high electron concentrations in the base (on the order of $0.5-5 \times 10^{18} cm^{-3}$) can be used without excessively reducing carrier mobility. This facilitates attaining small base sheet resistances. Also, the low electron scattering rate and consequent long mean free path at such high electron and ionized donor densities means that the base can be made relatively thick (of the order of 1000 Angstroms) and still maintain a reasonable transfer coefficient. A thick base further reduces that base sheet resistance.

Thus, we have found that the high group electron velocities characteristic of hot electrons in narrow energy gap semiconductors favor the use of narrow gap semiconductors to an extent not previously appreciated. These hot electron group velocities approach the speed of light in the material, making for every short transist times and consequently little opportunity for collisions, promoting long mean free paths. In addition, the different energy band structure discussed above of the lead salt and bismuth-antomony alloy semiconductors compared to the relevant Group III-Group V and Group II-Group IV semiconductors means that hotter electrons can be used in our materials without exciting electrons from the valence band to the conduction band, thus helping attain long hot electron mean free-paths. Also, the small effective masses at the L-points in our Proposed materials and the relatively large dielectric constants ($>$ or $=100$) in these materials make it possible to obtain large electron mobilities and hot electron mean free paths at relatively high doping levels. These factors make it possible to attain high transfer coefficients and small base sheet resistances in the same hot electron transistor. A small base sheet resistance helps toward a small parasitic RC time constant, improving device switching speed. Although the large dielectric constants of these materials also can lead to larger capacitances, thus tending to increase the RC time constant, the dielectric constant of the emitter and collector high energy gap barrier layers advantageously used in this invention may be reduced by combing the lead salts in random alloy or superlattice form with other materials as described below.

For example, with lead salt materials, such as lead telluride, europium may be partially substitued for the lead, and selenium in part for tellurium, to form the materials needed for forming the heterojunctions of the device. The resulting quaternary alloy, lead-europium-selenide-telluride, may be readily lattice-matched to lead telluride layers grown in either the (100) or (111) crystallographic directions. Moreover, it is also known that dismuth-antomony alloy layers may also be substantially lattice-matched to lead-telluride layers (and by implication to lead-europium-selenide-telluride layers) when these lead salt layers are grown inthe (111) crystallographic direction and the bismuth-antomony alloy layers are grown in the trigonal (001) direction. Other high energy band gap materials may be combined with lead telluride in random alloys or super-lattices to form the different, higher energy band gap materials needed to form the heterojunctions of the device. These include cadmium telluride, calcium telluride, strontium telluride or magnesium telluride.

One embodiment of the invention comprises a monocrystalline body which includes an emitter of lead telluride with fractional substitutions of europium for lead and selenium for tellurium, doped to be heavily n-type, an emitter tunneling barrier region which similarly is lead telluride with europium and selenium substitutions but essentially undoped or intrinsic, a base of lead telluride doped to be heavily n-type, a collector barrier region which is of lead telluride with varying amounts of europium and selenium to grade the band gap but essentially undoped to be intrinsic, and a collector of lead telluride doped to be heavily n-type.

This structure is formed advantageously as successive layers grown upon a monocrystalline substrate. This substrate may be coated with a layer of electrically insulating and/or lattice-constant-grading materials.

It should be noted that in the transistor structure described above and in those that follow, either the emitter or the collector layer may be grown upon the substrate or the substrate coating layer. If the collector layer is grown first, then the other layers will be grown in the reverse sequence to that described above, ending with the emitter layer.

Another embodiment of the invention comprises a monocrystalline body which includes an emitter of lead telluride doped to be heavily n-type, an emitter tunneling barrier region which similarly is lead telluride with europium and selenium substitutions but essentially undoped or intrinsic, a base of bismuth-antomony alloy doped to be heavily n-type, a collector barrier region which is of lead telluride with varying amounts of europium and selenium but essentially undoped to be intrinsic, and a collector of bismuth-antomony alloy or lead telluride, doped to be heavily n-type.

Arrangements other than an emitter tunneling barrier are known for injecting hot electrons into the base and such arrangements should be similarly applicable here. These include a graded junction emitter and a camel diode emitter.

Other embodiments will be described involving the substitution of appropriate superlattices for the mixed layers to achieve the desired difference in band gap consistent with good lattice matching to make feasible high quality crystallinity.

BRIEF DESCRIPTION OF THE DRAWINGS

The invention will be better understood from the following more detailed description taken in conjunction with the accompanying drawing in which:

FIGS. 3 and 4 shown the energy diagrams and compositions of alternative transistor embodiments of the invention.

DETAILED DESCRIPTION OF THE INVENTION

Figure 1:
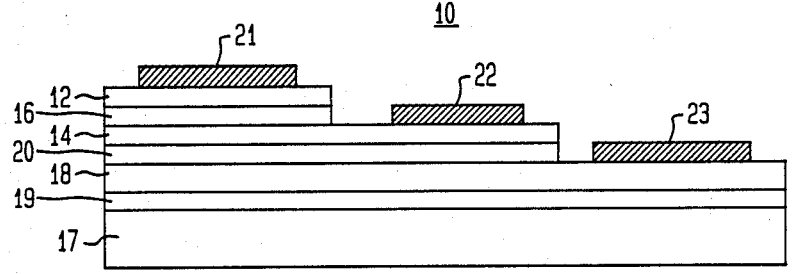
FIG. 1 shows in section the basic structure of a tunneling hot electron transistor in accordance with one embodiment of the invention.

With reference now to the drawing, FIG. 1 shows in cross-section, a ballistic transistor 10 that is of a geometry typical of tunneling hot electron ballistic transistors but that is formed using semi-conductive compounds characteristic of the invention. In typical fashion, the transistor includes an emitter 12, that is joined to the base 14 by way of the emitter tunnel barrier region 16, and a collector 18 that is joined to the base 14 by way of the graded collector barrier region 20.

The layers are grown to be lattice-matched upon a substrate coating layer 19 which provides electrical isolation and/or grading of the crystal lattice constant from that of the monocrystalline substrate 17 to that of the collector 18. The substrate 17 may for example be silicon, GaAs or $BaF_2$. The lattice-constant-grading coating may be $CaF_2/BaF_2$, $SrF_2/BaF_2$, PbTe, or CdTe. The alkaline earth flluorides tend to grow (111) oriented on (111) silicon or GaAs; and CdTe or PbTe that tend to grow (111) oriented, and $Bi_{1-x}Sb_x$ tends to grow (001) oriented (trigonal), on (111) $BaF_2$. This is partially due to the fact that the lattice constant of $BaF_2$ is only about 4% smaller than those of CdTe, PbTe, or $Bi_{1-x}Sb_x$. PbTe in the (100) orientation may be grown upon (100) oriented CdTe, and (111) oriented PbTe or (001) $Bi_{1-x}Sb_x$ may be grown upon (111) oriented CdTe. This follows in part from the fact that CdTe is nearly lattice-matched to PbTe and $Bi_{1-x}Sb_x$. CdTe and PbTe may be grown in either the (111) or (100) orientation upon (100) oriented gallium arsenide, depending upon the initial nucleation conditions. Many of these crystallographic relationships are described in the following publications. H. Zogg, *Appl. Phys. Lett.*, Vol 49, 933, 1986, L. A. Kolodziejski, et al., *Appl. Phys. Lett.*, Vol 45, 440, 1984, and J. Yoshino, H. Munekata, and L. L. Chang, *J. Vac. Sci. Technol. B*, Vol. 5,683, 1987.

Separate contacts 21, 22, and 23 make low resistance connections respectively to the emitter 12, base 14, and collector 18. These contacts are typically made of gold, silver, aluminum, indium, antimony, bismuth, copper, platinum, palladium, or of two or more of these materials in layered and/or alloy form. As shown, the emitter 12 is in the form of a mesa on a portion of the base 14, leaving part of the remaining portion of the base exposed where the base contact 22 can be readily applied. The base 14 and emitter 12 are further shown in the form of a mesa on a portion of the collector 18, leaving the remaining portion of the collector exposed where the collector contact 23 can be readily applied. Of course, other geometries are feasible. The various regions are grown to be well lattice matched from the emitter 12 to the top portion of layer 18 so that the active structure is essentially monocrystalline. The crystalline quality of the base and its two bordering barrier regions are of special importance to insure collision-free passage of a large fraction of the signal electrons from the emitter to the collector.

Figure 2:
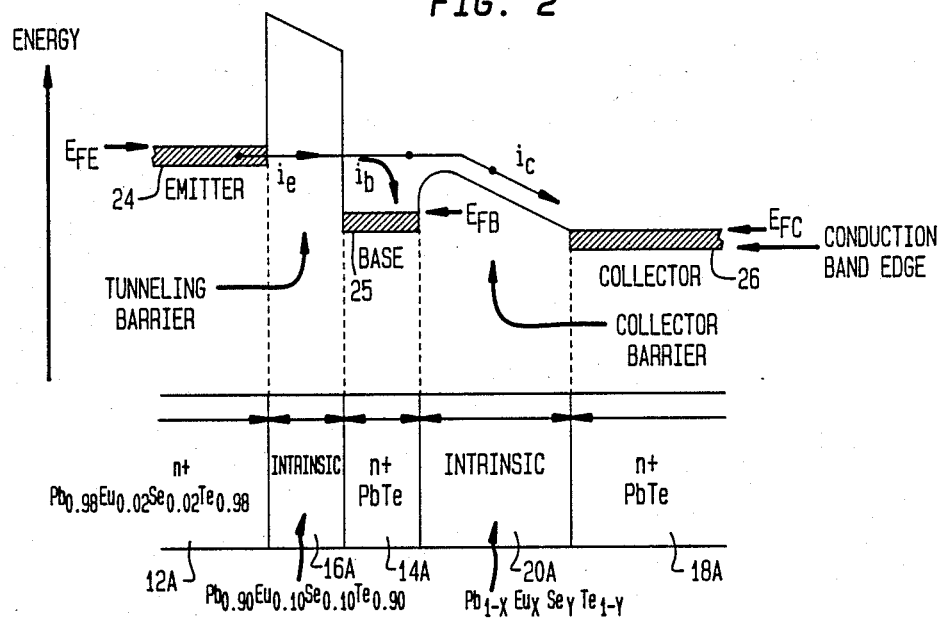
FIG. 2 shows the energy diagram of the active regions of the structure shown in FIG. 1 along with the compositions of the different regions for an embodiment of the invention using lead salts for the active regions.

In accordance with one illustrative embodiment, as depicted in the energy diagrams of FIG. 2, the host crystal for the active regions is primarily of PbTe and the emitter 12 is of n+ type $Pb_{0.98}Eu_{0.02}Se_{0.02}Te_{0.98}$ and about one half micron thick, the tunnel barrier region 16 is essentially intrinsic $Pb_{0.90}Eu_{0.10}Te_{0.90}$ and about 100 Angstroms thick, the base is n+ type PbTe and about 800 Angstroms thick, the graded collector barrier region 20 is of essentially intrinsic $Pb_{1-x}Eu_xSe_yTe_{1-y}$, where x varies from 0 to about 0.03, and Y varies from 0 to about 0.04, and about 800 Angstroms thick, and the collector 18 is n+ type PbTe of between one half and 10 microns thick. Although not shown in FIG. 2, because they are inactive electrically, the coating layer 19 typically is (111) or (100) oriented CdTe or PbTe, about 1000 Angstroms thick, and the substrate 17 is monocrystalline GaAs, and typically is undoped or chromium-doped to have very high electrical resistance. Typically, the multilayer structure is formed by forming successive layers epitaxially by molecular beam deposition in known fashion.

As is more fully described in U.S. Pat. No. 4,608, 694, which was issued on Aug. 26, 1986, to Dale L. Partin, partial substitution of europium for lead in lead tellurium widens the band gap. The partial substitution of selenium for tellurium is largely to compensate for the change in crystal lattice constant of the europium addition whereby the crystal lattice constant is left unchanged by the two additions. Additionally, n-type doping can be achieved either by including excess lead or by the addition of small amounts of bismuth, cadmium or copper, the bismuth addition being the preferred technique. Conversely, p-type doping can be achieved either by including excess telluride or by the additon or thallium, silver, or sodium, the thallium addition being the preferred technique.

FIG. 2 also includes the conduction band edge of the structure described in connection with FIG. 1 taken along a vertical section, with an emitter-to-base applied voltage of $V_{BE}$ to provide a current of electrons $I_e$ tunneling from the emitter 12 to the base 14. There are also shown the Fermi levels $E_{FE}$, $E_{FB}$, and $E_{FC}$ along with the conduction band edges 24, 25, and 26 for the emitter, base and collector, respectively. The inactive substrate and substrate coating layer of FIG. 1 are not included in FIG. 2.

As is characteristic of a ballistic transistor, there are a number of requirements which need to be satisfied for the desired operation. The properties including band gap and doping of the emitter 12A and base 14A are chosen so that after the emitter-base bias is applied, there is developed at the barrier region 16A between the emitter and base an emitter-base conduction band step having a high potential barrier on the emitter side and a sharp potential drop on the base side, as shown. The height of the barrier needs to be sufficient that electrons tunneling across the barrier develop sufficient kinetic energy to accelerate the electrons through the base without scattering electrons into upper valley energy levels in the base. After transversing the base, the electrons that remain hot enough to penetrate the collector barrier 20A into the collector 18A form the collector current $I_C$. A fraction of the electrons that tunnel into the base 14A will undergo collisions in the base 14A or in the collector barrier region 20A close to the base and are cooled down to an energy close to that of the Fermi level in the base and are removed from the base by flowing out of the base perpendicularly to the plane of FIG. 2 and form the base current $I_B$. The ratio of the collector current to the emitter current is defined as the transfer coefficient. The ratio of the collector current to the base current is generally defined as the gain of the device.

To facilitate collection, the collector barrier advantageously is graded by varying the amount of europium and selenium substitutions and the Fermi level in the collector is adjusted to be below that in the base via a base-collector bias.

The applied voltage $V_{BE}$ causes electrons to tunnel from the emitter 12A to the base 14A through the emitter tunneling barrier 16A. To keep thermally activated currents desirably small relative to the tunneling current, it is necessary to refrigerate the device, typically to quite low temperatures where the thermal currents are small and easily restricted by the height of the emitter tunneling barrier and the graded collector barrier. The grading of the collector barrier 20A serves to reduce the quantum mechanical reflection at the collector 18A and to achieve a bias-dependent barrier height.

In n-type lead salt materials of the kind described at 77° Kelvin and at dopings of about $5 \times 10^{18}$ ions per cubic centimeter, mobilities of between 10,000 and 20,000 cm$^2$/Vsec are possible. Since an electron injected 0.1 eV above the conduction band edge has a mean free path of about 3000 Angstroms, an 800 Angstroms thick base region of this doping will still permit a very low collision rate for electrons tranversing it.

Moreover, in these materials, the electron group velocity can approach the speed of light in the material and typically will be more than a factor of ten faster than the typical Group III–Group V compounds, such as GaAs, at relatively low electron temperatures.

In FIG. 3, there is shown the energy diagram of a form of hot electron transistor in accordance with the invention that uses graded barriers 31 and 32 between the emitter 34 and base 36 and between the base 36 and the collector 38, respectively. As depicted, the barrier 31 is graded so that the lower edge of the conduction band tilts upwards above the barrier height of the base 36 so that hot electrons are injected into the base with energies above the height of the graded collector barrier 32 for easy penetration of the barrier. As shown, in this embodiment, the emitter 34, base 36, and collector 38 are of lead telluride and the barriers 31 and 32 are each of graded $Pb_{1-x}Eu_xSe_yTe_{1-y}$ where x varies between 0 and about 0.1 and Y varies between 0 and about 0.1.

FIG. 4 shows another transistor embodiment of the invention that employs camel diode emitter and collector barriers of the kind known in the art and is characterized by the use throughout of lead telluride appropriately doped to provide the distinctive double hump in the conduction band edge as shown. In particular the transistor 10 includes the heavily doped n-type emitter 40, the intrinsic emitter first barrier region 41, the very heavily doped p-type thin emitter barrier region 42, followed by the intrinsic emitter second barrier region 43, followed by the heavily doped n-type base region 44, followed by the first intrinsic collector barrier region 45, followed by the thin very heavily doped p-type collector barrier region 46, followed by the second intrinsic collector barrier region 47 and ending with the heavily doped collector 48.

As mentioned earlier, the various structures described are best formed by molecular beam epitaxy in which successive layers of molecules of the desired composition are deposited on an appropriate single crystal substrate in a manner to grow the deposited layers epitaxially over the substrate, although it is feasible to employ ion implantation to introduce dopants into desired regions of the structure.

As mentioned earlier, the $Bi_{1-x}Sb_x$ alloy system for $0 <\text{or}= x <\text{or}= 0.35$ (which has been described herein as the bismuth-antimony alloy system) has many properties in common with lead salts which make it useful for hot electron transistors. $Bi_{1-x}Sb_x$ is more rigorously defined as a semimetal for $0 <\text{or}= x <\text{or}= 0.08$, and as a semiconductor only in the range $0.08 < x <\text{or}= 0.35$ because of the movement of hole T-bands (J. Heremans and J. P. Micheraud: *J. Phys. C.: Solid State Phys.*, 18, 6033, 1985) relative to the L-bands as x increases. Nevertheless, as is often done, herein we generally will refer to $Bi_{1-x}Sb_x$ for $0 <\text{or}= x <\text{or}= 0.35$ as a bismuth-aantomony alloy semiconductor. For a hot electron transistor based entirely on lead salts, as in FIGS. 2, 3, and 4, it is feasible to substitute layers of the opposite type doping for each of the doped layers in the devices described to utilize holes as the charge carriers instead of electrons, since L-band holes in lead salts generally have mobilities nearly equal to mobilities of L-band electrons. (This is very unlike the case of Group III–Group V and Group II–Group VI materials.) In this case, the energy diagrams would be inverted and the valence band edge would be the meaningful edge. However, in the case of hot electron transistors with bismuth-antimony alloys, only devices based on electrons are feasible, except at very low temperatures for x greater than 0.08, because of the low mobility of T-band holes.

Normally, high purity $Bi_{1-x}Sb_x$ for $0 <\text{or}= x <\text{or}= 0.35$ has appeciable numbers of electrons and holes because of the narrowness of the energy band gap in the semiconductor range $(0.08 < x <\text{or}= 0.35)$, and because of the overlap between electron and T-hole bands in the semimetal range $(0 <\text{or}= x <\text{or}= 0.08)$. Most of the holes would be in the large effective mass and, therefore low mobility, T-band and so play little role in carrier transport relative to the small effective mass, high mobility, L-band electrons. However, the material can be doped to be n-type with donors such as tellurium or selenium. Finally, p-type doping can be accomplished with addition of lead or tin.

Figure 5:
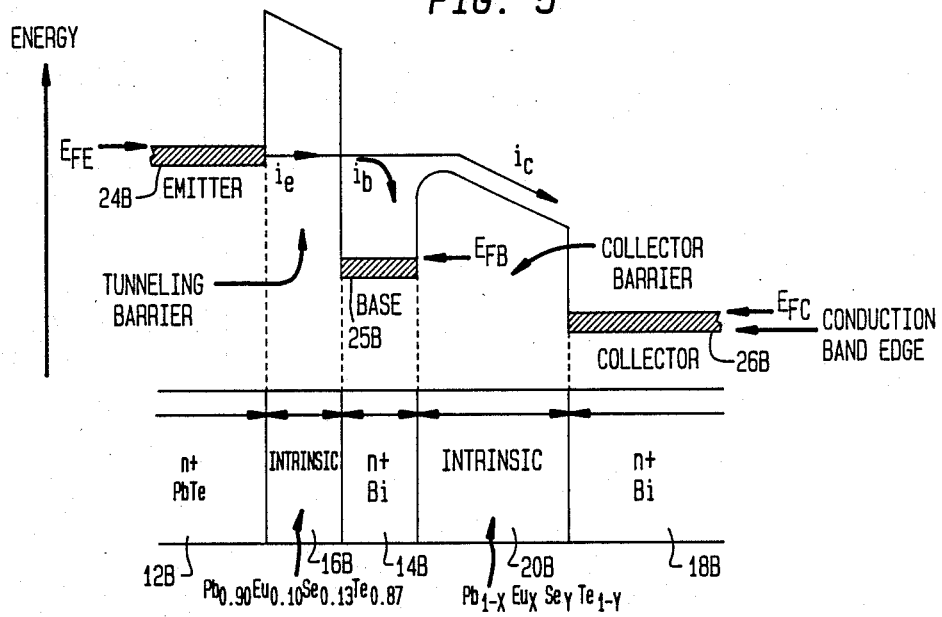
FIG. 5 shows the energy diagram and composition of the active regions of the structure in FIG. 1 using regions of bismuth and of lead salts.

FIG. 5 shows schematically an embodiment of the conduction band edge of the transistor structure described in connection with FIG. 1 taken along a vertical section, in which bismuth (an end point of the bismuth-antomony alloy range) is used for the base 14B and the collector 18B with an n+ type PbTe emitter 12B, and much of its description is similar to that for FIG. 2. For either Bi layer, the material may be essentially undoped, with approximately equal numbers of electrons and (mostly irrelevant) holes, or higher electron concentrations can be achieved by n-type doping with elements such as Te or Se, as mentioned above.

The thicknesses of the layers in FIG. 5 may be similar to those in FIG. 2, except that the Bi base 14B may safely be widened to about 1000 Angstroms because of the relatively long mean free path of hot electrons in Bi. This in combination with the very large mobility of electrons in Bi, which can be of the order of 300,000 to 600,000 cm$^2$/v-s at 77 K, means that very low base sheet resistances can be attained. We prefer to dope the base so that its electron concentration is about $1 \times 10^{18}$ cm$^{-3}$, although a range $3 \times 10^{17}$ to $5 \times 10^{18}$ cm$^{-3}$ ($E_F = 82$ meV) may be useful. At $9 \times 10^{17}$ cm$^{-3}$, the Fermi energy is large enough ($E_F = 43$ meV) that hot electrons with very substantial energies E, for example, 100 meV may be used, according to inequality (2). Note that $E_G$ in this inequality is the L-point gap, which is about 14 meV in Bi. A bismuth-antimony alloy can be used as a base material, either in the form of a random alloy or a superlattice (Bi$_{1-x}$Sb/$_x$/Bi$_{1-y}$Sb$_y$, $0 <$ or $= x <$ or $= 0.35$, $x < y < 1$), with increased L-point gap. The graded collector barrier region 20B is of essentially intrinsic Pb$_{1-x}$Eu$_x$Se$_y$Te$_{1-y}$, where x varies from 0 to 0.03 and y varies from 0 to 0.10 (for lattice matching to Bi). The selenium concentration of the tunneling barrier 16B is adjusted to give a 220 in-plane lattice parameter midway between that of PbTe (2.280 Angstroms) and Bi (2.272 Angstroms). These lattice parameters are taken from S. C. Shin, J. E. Hilliard, and J. B. Ketterson, *Thin Solid Films*, Vol. III, p. 323–330, 1984, which also describes some of the theory and technology of PbTe/Bi heterojunctions. Exact lattice matching is generally not required for sufficiently thin films which can elastically expand or contract within certain limits. Other aspects of the fabrication, integration, and operation of this device are similar to those described above in connection with the device shown in FIG. 2. Typically, this multilayer structure is formed by forming successive layers epitaxially by molecular beam deposition in known fashion.

A variation of the structure shown in FIG. 5, can use an n-type PbTe for the collector 18B. In this case, x varies from 0 to 0.03 and y from 0 to 0.06 in the graded collector barrier 20B.

Another variation of the structure shown in FIG. 5, can use heavily n-type Bi or Bi$_{1-x}$Sb$_x$ for the emitter 12B. In this case the selemium concentration in the emitter tunneling barrier 16B is changed from $y=0.13$ to $y=0.16$ for lattice matching to Bi.

Another variation of the structure shown in FIG. 5, uses a heavily n-type Bi emitter, and the emitter tunneling barrier is nominally undoped or intrinsic PbTe, and the collector barrier is nominally undoped or intrinsic Pb$_{1-x}$Sn$_x$Te, where the tin concentration is graded in the range $0 <$ or $= x <$ or $= 0.1$.

It is similarly possible to modify the embodiments shown in FIGS. 3 and 4 in an analogous manner to substitute for lead salt layers of the bismuth-antomony alloy described.

Again, in all of the embodiments of the invention described herein, molecular beam epitaxy typically is the preferred way for forming such multilayered structures. In addition to the usual molecular beam epitaxial growth technique of thermal evaporation or sublimation form resistance heated crucible sources, electron beam heating or laseer ablation may generally also be used to evaporate or sublimate source materials such as Bi, PbTe, CdTe, Te, etc. Another growth technique which can be used for some of these materials is metal organic chemical vapor depoosition, in some cases using plasma or optically assisted growth.

In some instances, it may prove also desirable to substitute for the mixed Pb$_{1-x}$Eu$_x$Se$_y$Te$_{1-y}$ layers in the structures described with layers of other materials, appropriately lattice-matched to achieve the desired change in energy band gap for such layers. A possible technique involves a superlattice of r-PbTe/s-CdTe in which r and s are integers and denote a structure in which regions of r monolayers of PbTe alternate with s monolayers of CdTe in the fashion characteristic of superlattices. By appropriate choice of r and s, there can be achieved a band gap whose width is intermediate between the small value (0.2 eV) for PbTe and the larger value (1.4 eV) for CdTe. Again, in usual fashion, molecular beam epitaxy would be the preferred way for forming such superlattices, although metal organic vapor phase epitaxy is a possible alternative growth technique for many of these structures.

Other superlattices possible to substitute for Pb$_{1-x}$Eu$_x$Se$_y$Te$_{1-y}$ include r-PbSe/s-EuTe. Another possibility is r-PbSe/s-EuTe/t-PbTe where r might be 3, and s might be 8 to provide a good lattice match with PbTe and t is arbitrary and chosen to adjust the energy band gap, dielectric constant, and carrier effective mass of the resulting crystal. Some additional possiblilities include r-PbTe/s-EuTe, r-PbPe/s-CaTe, and r-PbTe/s-SrTe.

The various transistors described may be operated in the usual fashion and connected in either a common emitter, common base, or common collector circuit configuration, as is usual for ordinary silicon junction transistors.

The embodiments of the invention in which an exclusive property or privilege is claimed are defined as follows:

1. A hot electron transistor formed in a semiconductive body comprising a plurality of monocrystalline, lattice matched semiconductive layers that include at least one layer consisting essentially of Bi$_x$Sb$_{1-x}$ where $0 <$ or $= x <$ or $= 0.35$ for respectively providing a transistor base region, and additional layers for respectively providing transistor emitter and collector regions, a potential barrier between the emitter and base regions after an emitter/base bias is applied that is high enough on the emitter side and drops sharply on the base side to permit electrons crossing the barrier to develop sufficient kinetic energy to accelerate them through the base region without scattering electrons into upper valley energy levels in the base, effective to provide a transistor in which electrons are injected from the emitter region into the base region for collection by the collector region at ballistic velocities for substantially collision-free passage through the base region.

2. The hot electron transistor of claim 1 in which intermediate between the emitter and base and between the base and collector are barrier regions.

3. The hot electron transistor of claim 2 in which the barrier region between the emitter and base is essentially of Pb$_{0.90}$Eu$_{0.10}$Se$_{0.10}$Te$_{0.90}$ and the barrier region between the base and collector is essentially of PbEuSeTe in which the fraction of Eu increases from 0 to 0.03 and the fraction of Se increases from 0 to 0.04 between the base and the collector.

4. The hot electron transistor of claim 1 in which the emitter, base and collector are each heavily doped of one conductivity type and intermediate between the emitter and base and between the base and collector are separate barrier regions comprising a layer heavily doped of the opposite conductivity type between layers relatively free of doping to form camel-type diode emitter and collector barriers.

5. The hot electron transistor of claim 2 in which at least one of said barrier regions is a superlattice lattice matched to the base and collector regions.

6. The hot electron transistor of claim 5 in which the superlattice comprises layers of PbSe and EuTe.

7. The hot electron transistor of claim 5 in which the superlattice comprises layers of PbSe, EuTe, and PbTe.

8. The hot electron transistor of claim 5 in which the superlattice comprises layers of PbTe and CdTe.

9. A hot electron transistor comprising in succession a layer of PbTe for serving as the emitter, a layer of PbEuSeTe for serving as an emitter tunnel barrier region, a layer of $Bi_xSb_{1-x}$, where $0 \leq x \leq 0.35$, for serving as the base, a graded layer of PbEuSeTe for serving as the collector barrier region, and a layer of $Bi_xSb_{1-x}$, where $0 \leq x \leq 0.35$, for serving as the collector.

10. The hot electron transistor of claim 9 in which the emitter, base and collector layers are doped n-type and the barrier regions are undoped.

11. The hot electron transistor of claim 10 in which the emitter tunnel barrier region is $Pb_{0.90}Eu_{0.10}Se_{0.13}Te_{0.87}$ and the collector barrier region is $Pb_{1-x}Eu_xSe_yTe_{1-y}$, where x varies from 0 to 0.03 and y varies from 0 to 0.10.

12. The hot electron transistor of claim 2 in which the emitter region is of lead telluride and the emitter and collector barrier regions are of lead europium selenide telluride alloys suitable for lattice matching.

13. The hot electron transistor of claim 12 in which the emitter region is n-type PbTe, the emitter barrier region is intrinsic $Pb_{0.90}Eu_{0.10}Se_{0.13}Te_{0.87}$, the base region is n-type bismuth, the collector barrier region is intrinsic $Pb_{1-x}Eu_xSe_yTe_{1-y}$ where x varies from 0 to 0.03 and y varies from 0 to 0.10 for lattice matching and the collector region is n-type bismuth.

* * * * *